US006480397B1

(12) United States Patent
Hsu et al.

(10) Patent No.: US 6,480,397 B1
(45) Date of Patent: Nov. 12, 2002

(54) COVER STRUCTURE FOR PORTABLE ELECTRONIC DEVICE

(75) Inventors: Che-Yuan Hsu, Tu-Chen (TW); Yonk Yang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/011,522

(22) Filed: Nov. 5, 2001

(30) Foreign Application Priority Data

Jul. 27, 2001 (TW) ...................................... 90212837 U

(51) Int. Cl.[7] .............................. H04B 1/03; H05K 7/14; H05K 5/02; H05K 9/00
(52) U.S. Cl. ...................... 361/814; 361/752; 361/758; 361/759; 361/818; 455/575; 455/347
(58) Field of Search ................................. 361/679, 683, 361/752, 757, 759, 801–803, 814, 816, 818, 825, 758; 248/222.11; 174/50, 66; 455/90, 575, 347

(56) References Cited

U.S. PATENT DOCUMENTS 5,150,282 A * 9/1992 Tomura et al. ............. 361/424
5,373,104 A * 12/1994 Brauer ....................... 174/52.1
6,359,787 B1 * 3/2002 Peltolehto et al. .......... 361/752

* cited by examiner

Primary Examiner—David Martin
Assistant Examiner—Dameon E. Levi
(74) Attorney, Agent, or Firm—Wei Te Chung

(57) ABSTRACT

A cover structure (1) for a portable electronic device includes a metallic shell (10) and a plastic mounting frame (9) secured to the shell. The shell has a skirting panel (101) and a bottom panel (100) which cooperatively define a space (102) for receiving the mounting frame. The frame includes a U-shaped part (11) and an arcuate part (12) which are respectively dimensioned to closely fit onto corresponding end portions of the shell. Each of the U-shaped and arcuate parts includes at least one threaded post (112, 121) adapted for engaging with a corresponding fastening member (3), in order to fasten a printed circuit board (2) of the portable electronic device to the cover structure.

7 Claims, 2 Drawing Sheets

COVER STRUCTURE FOR PORTABLE ELECTRONIC DEVICE

FIELD OF THE INVENTION

The present invention relates to cover structures for portable electronic devices such as mobile phones, and particularly to cover structures having outer metallic shells and inner plastic mounting frames.

BACKGROUND OF THE INVENTION

At present, most portable electronic devices such as mobile phones have covers that are either made entirely of metal or made entirely of plastic material. When the cover is made entirely of metal, the cost is relatively high and the portable electronic device is rendered unduly heavy. In addition, mounting of electronic components on a printed circuit board of the electronic device to the cover is problematic. When the cover is made entirely of plastic, an outer surface of the cover is easily scratched. This detracts from the aesthetic appearance of the electronic device. Furthermore, the cover does not provide good protection against electromagnetic interference (EMI).

Therefore, an improved cover structure for a portable electronic device such as a mobile phone is desired to overcome the disadvantages of the prior art.

SUMMARY OF THE INVENTION

A main object of the present invention is to provide a light cover structure of a portable electronic device adapted for fastening a printed circuit board (PCB) to the cover structure.

Another object of the present invention is to provide a light cover structure which resists surface-scratching.

A further object of the present invention is to provide a light cover structure which can provide good protection against electromagnetic interference (EMI).

A cover structure for a portable electronic device in accordance with the present invention comprises a metallic shell and a plastic mounting frame secured to the shell. The shell has a skirting panel and a bottom panel, which cooperatively define a space for receiving the mounting frame. The frame comprises a U-shaped part and an arcuate part which are respectively dimensioned to closely fit onto corresponding end portions of the shell. Each of the U-shaped and arcuate parts comprises at least one threaded post adapted for engaging with a corresponding fastening member, in order to fasten a PCB of the portable electronic device to the cover structure.

Other objects, advantages and novel features of the invention will become more apparent from the following detailed description of a preferred embodiment thereof when taken in conjunction with the accompanying drawings, wherein:

DETAILED DESCRIPTION OF THE INVENTION

Figure 1:
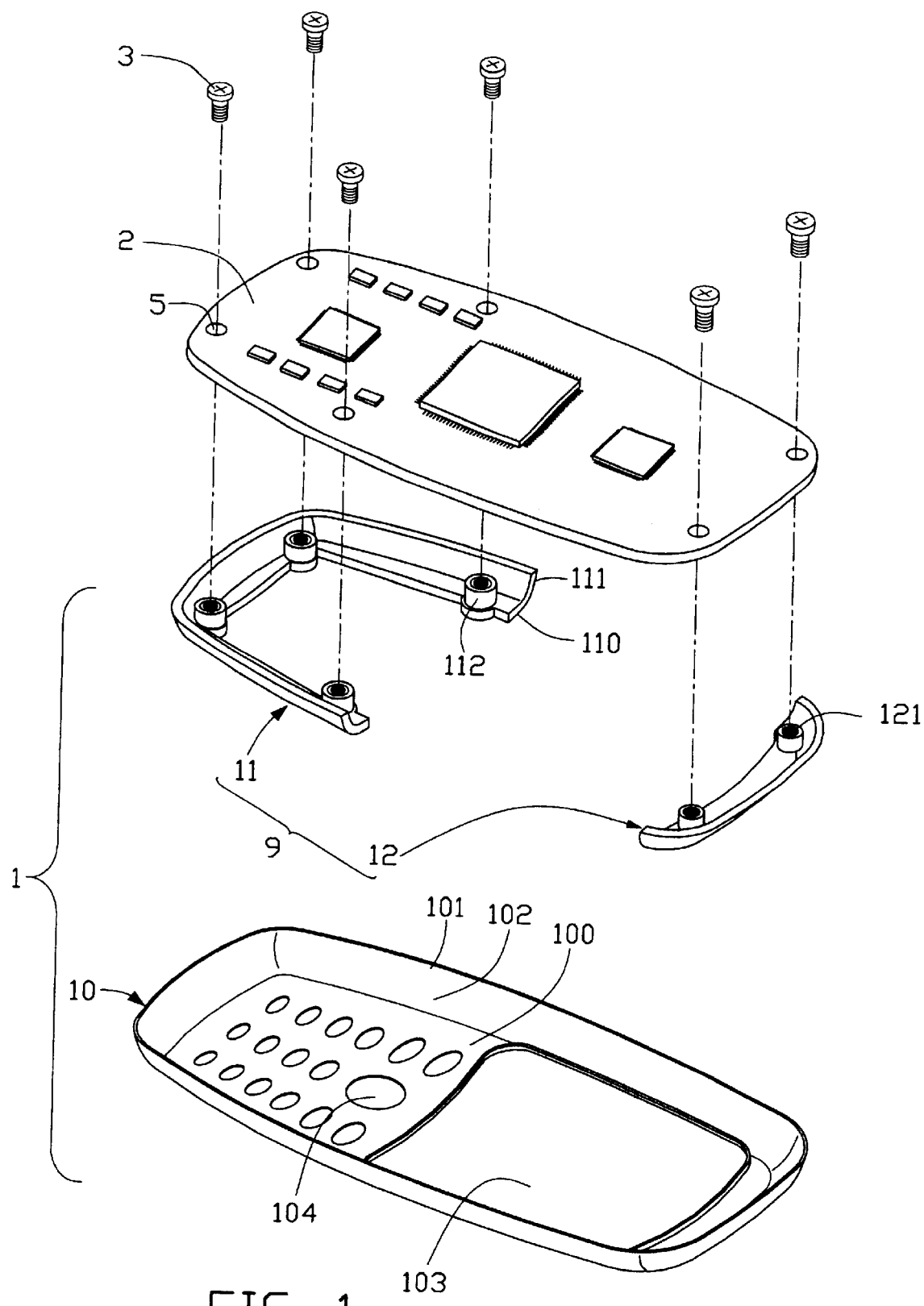
FIG. 1 is an exploded perspective view of a cover structure in accordance with a preferred embodiment of the present invention, together with a printed circuit board (PCB) to be mounted to the cover structure.

Referring now to the drawings in detail, FIG. 1 shows a cover structure 1 in accordance with a preferred embodiment of the present invention, together with a printed circuit board (PCB) 2. The cover structure 1 and PCB 2 are for a mobile phone.

Various electronic components are fixed on the PCB 2. A liquid crystal display (LCD) (not visible) is mounted on a bottom face of the PCB 2. The PCB 2 also has a plurality of keypads (not visible). Six bores 5 are defined in the PCB 2, for extension of six screws 3 therethrough respectively.

The cover structure 1 comprises a shell 10 made of metal, and a mounting frame 9 made of insulative material such as plastic. The shell 10 has a bottom panel 100 and a skirting panel 101, which cooperatively define a space 102 for receiving the mounting frame 9. The bottom panel 100 further includes a plurality of keypad holes 104 and a display window 103.

The mounting frame 9 comprises a first U-shaped part 11 and a second arcuate part 12. In the preferred embodiment, the U-shaped and arcuate parts 11, 12 are made of plastic. The U-shaped and arcuate parts 11, 12 are respectively dimensioned to closely fit onto corresponding end portions of the shell 10. The U-shaped part 11 has a bottom wall 110, a skirting wall 111 generally perpendicular to the bottom wall 110, and four internally threaded posts 112 extending upwardly from the bottom wall 110. The arcuate part 12 has a bottom wall (not labeled), a side wall (not labeled) generally perpendicular to the bottom wall, and two internally threaded posts 121 extending upwardly from the bottom wall (not labeled).

Figure 2:
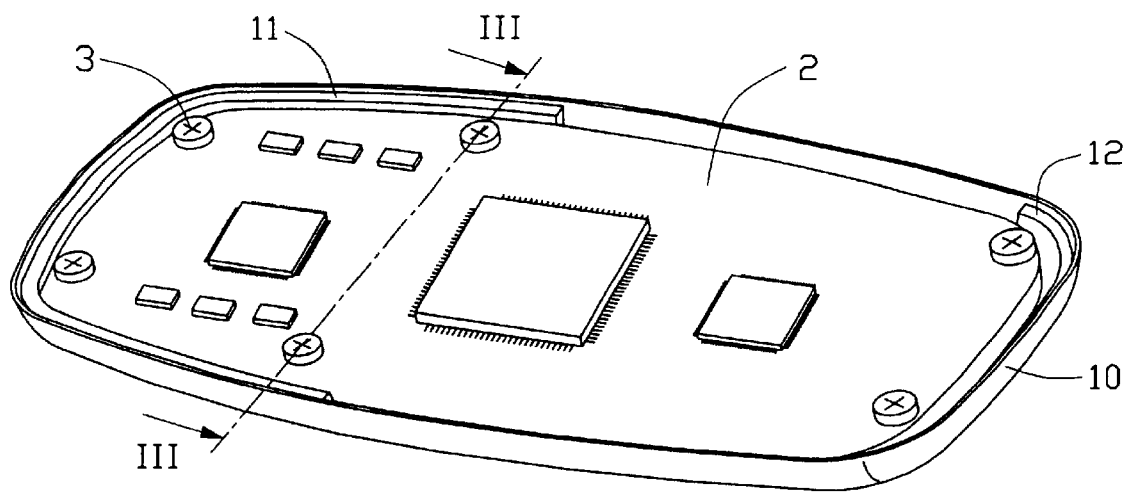
FIG. 2 is an assembled view of FIG. 1.
Figure 3:
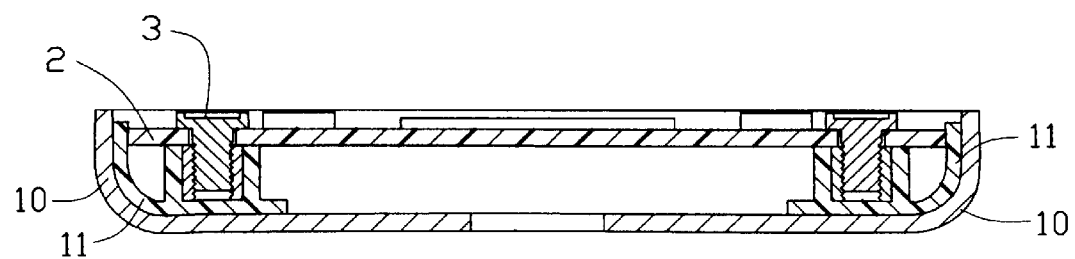
FIG. 3 is a schematic cross-sectional view taken along line III—III of FIG. 2.

In assembly, the U-shaped and arcuate parts 11, 12 are secured to respective end portions of the shell 10. Bottom surfaces of the bottom walls (110, not labeled) of the U-shaped and arcuate parts 11, 12 are glued to an inner surface of the bottom panel 100 of the shell 10. Outer surfaces of the skirting and side walls (111, not labeled) of the U-shaped and arcuate parts 11, 12 are glued to an inner surface of the skirting panel 101 of the shell 10. The cover structure 1 is thus completely assembled FIGS. 2 and 3 show the PCB 2 secured to the cover structure 1. The PCB 2 is placed over an inner side of the cover structure 1, and the bores 5 of the PCB 2 are aligned with the posts 112, 121 of the cover structure 1. The LCD of the PCB 2 extends through the display window 103 of the shell 10 and the keypads extend through the keypad holes 104 of the shell 10. The screws 3 are extended through the bores 5 to threadedly engage in the posts 112,121. The PCB 2 is thus securely fastened to the cover structure 1.

It is understood that the invention may be embodied in other forms without departing from the spirit thereof. Thus, the present examples and embodiment are to be considered in all respects as illustrative and not restrictive, and the invention is not to be limited to the details given herein.

What is claimed is:

1. A cover structure for a portable electronic device, the cover structure comprising:

a metallic shell having a bottom panel, a skirting panel, and a receiving space between the bottom panel and the skirting panel; and a mounting frame secured to the shell in the receiving space, the mounting frame comprising a first pad attached to a first portion of the shell and a second part attached to a second portion of the shell, each of the first and second parts comprising at least one post adapted for engaging with a corresponding fastening member to fasten a printed circuit board of the portable electronic device to the cover structure; wherein the first part of the frame is U-shaped, and the second part of the frame is arcuate, and the second part of the frame is smaller than the first part of the frame; wherein each of the first and second parts of the frame has a bottom wall and another wall substantially perpendicular to the bottom wall, the at least one post extending upwardly from the bottom wall, and each of the at least one plastic post defining a threaded hole therein.

2. The cover structure as claimed in claim 1, wherein the first part of the frame is dimensioned to closely fit onto the first portion of the shell, and the second part of the frame is dimensioned to closely fit onto the second portion of the shell.

3. The cover structure as claimed in claim 1, wherein each of the first and second parts of the frame is glued to the shell.

4. The cover structure as claimed in claim 3, wherein the mounting frame is made of plastic material.

5. A cover structure for a portable electronic device, the cover structure comprising:

a metallic shell having a bottom panel, a skirting panel, and a receiving space between the bottom panel and the skirting panel; and a mounting frame secured to the shell in the receiving space, the mounting frame comprising a first part attached to a first portion of the shell and a second part attached to a second portion of the shell, each of the first and second parts comprising at least one post adapted for engaging with a corresponding fastening member to fasten a printed circuit board of the portable electronic device to the cover structure; wherein each of the first and second parts of the frame has a bottom wall and another wall substantially perpendicular to the bottom wall, the at least one post extending upwardly from the bottom wall, and each of the at least one plastic post defining a threaded hole therein.

6. The cover structure as claimed in claim 5, wherein each of the first and second parts of the frame is glued to the shell.

7. The cover structure as claimed in claim 5, wherein the mounting frame is made of plastic material.

* * * * *